US012518983B2

(12) United States Patent
Song et al.

(10) Patent No.: US 12,518,983 B2
(45) Date of Patent: Jan. 6, 2026

(54) UNIT FOR SUPPLYING CHEMICAL AND APPARATUS FOR TREATING SUBSTRATE WITH THE UNIT

(71) Applicant: SEMES CO., LTD., Chungcheongnam-do (KR)

(72) Inventors: Soo Han Song, Gyeonggi-do (KR); Jung Bong Choi, Gyeonggi-do (KR); Kang Seop Yun, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 450 days.

(21) Appl. No.: 18/138,037

(22) Filed: Apr. 22, 2023

(65) Prior Publication Data
US 2024/0047236 A1 Feb. 8, 2024

(30) Foreign Application Priority Data

Aug. 2, 2022 (KR) .................. 10-2022-0096234

(51) Int. Cl.
*H01L 21/67* (2006.01)
*H01L 21/02* (2006.01)
(52) U.S. Cl.
CPC .. *H01L 21/67051* (2013.01); *H01L 21/02052* (2013.01); *H01L 21/6715* (2013.01)
(58) Field of Classification Search
CPC ................................................ H01L 21/67051
See application file for complete search history.

(56) References Cited

U.S. PATENT DOCUMENTS 10,052,647 B2 8/2018 Diebel
2012/0227770 A1 9/2012 Kaneko et al.

FOREIGN PATENT DOCUMENTS

| JP | 2008-112837 | 5/2008 |
| KR | 10-2008-0110007 | 12/2008 |
| KR | 10-2012-0103465 | 9/2012 |
| KR | 10-2016-0111950 | 9/2016 |

OTHER PUBLICATIONS

Notice of Allowance dated Jun. 27, 2024 for Korean Patent Application No. 10-2022-0096234 and its English translation from Global Dossier.
Office Action dated Jan. 2, 2024 for Korean Patent Application No. 10-2022-0096234 and its English machine translation by Google Translate.

*Primary Examiner* — Jason Y Ko
(74) *Attorney, Agent, or Firm* — WOMBLE BOND DICKINSON (US) LLP

(57) ABSTRACT

The present disclosure provides an apparatus for treating a substrate, comprising: a chemical discharge pipe; a cover configured to surround the chemical discharge pipe; a buffer disposed in a space between the chemical discharge pipe and the cover; a chemical supplier configured to supply a chemical to the chemical discharge pipe; a cleaning liquid supplier configured to supply a cleaning liquid via the cover; and a dry gas supplier configured to supply a dry gas via the cover, wherein the supplied cleaning liquid is sprayed by passing through the buffer via a space between the outside of the chemical discharge pipe and the inside of the cover to clean a tip of the chemical discharge pipe, and the supplied dry gas is sprayed by passing through the buffer via the space between the outside of the chemical discharge pipe and the inside of the cover to dry the tip of the chemical discharge pipe.

19 Claims, 6 Drawing Sheets

[FIG. 1]
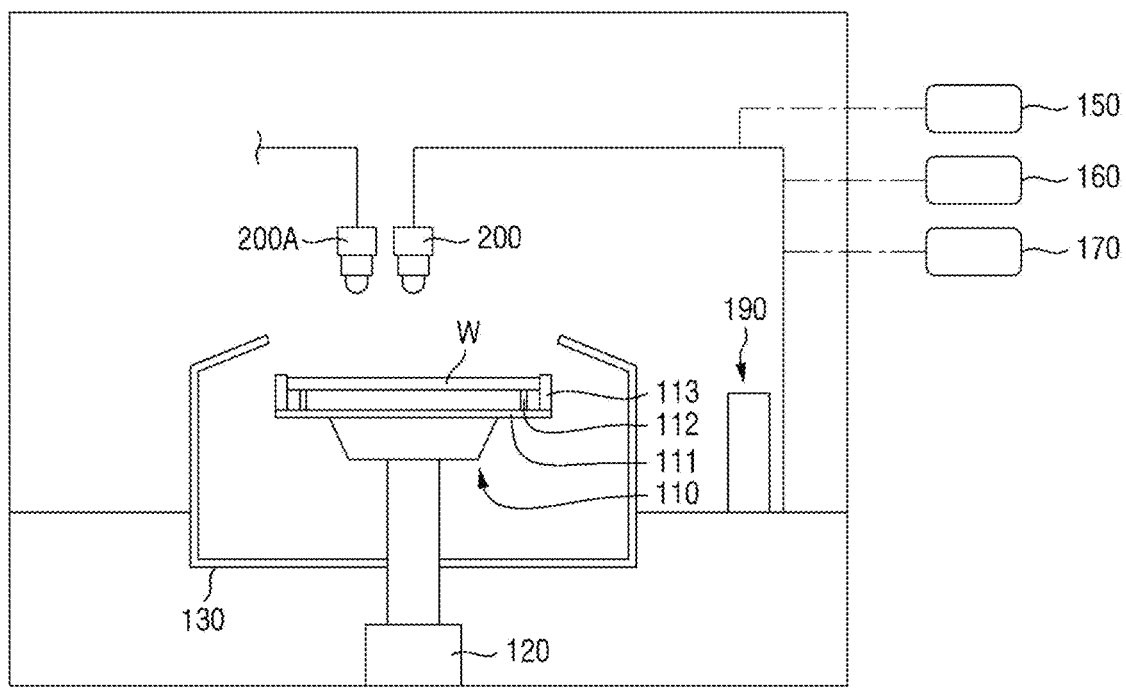

[FIG. 2]
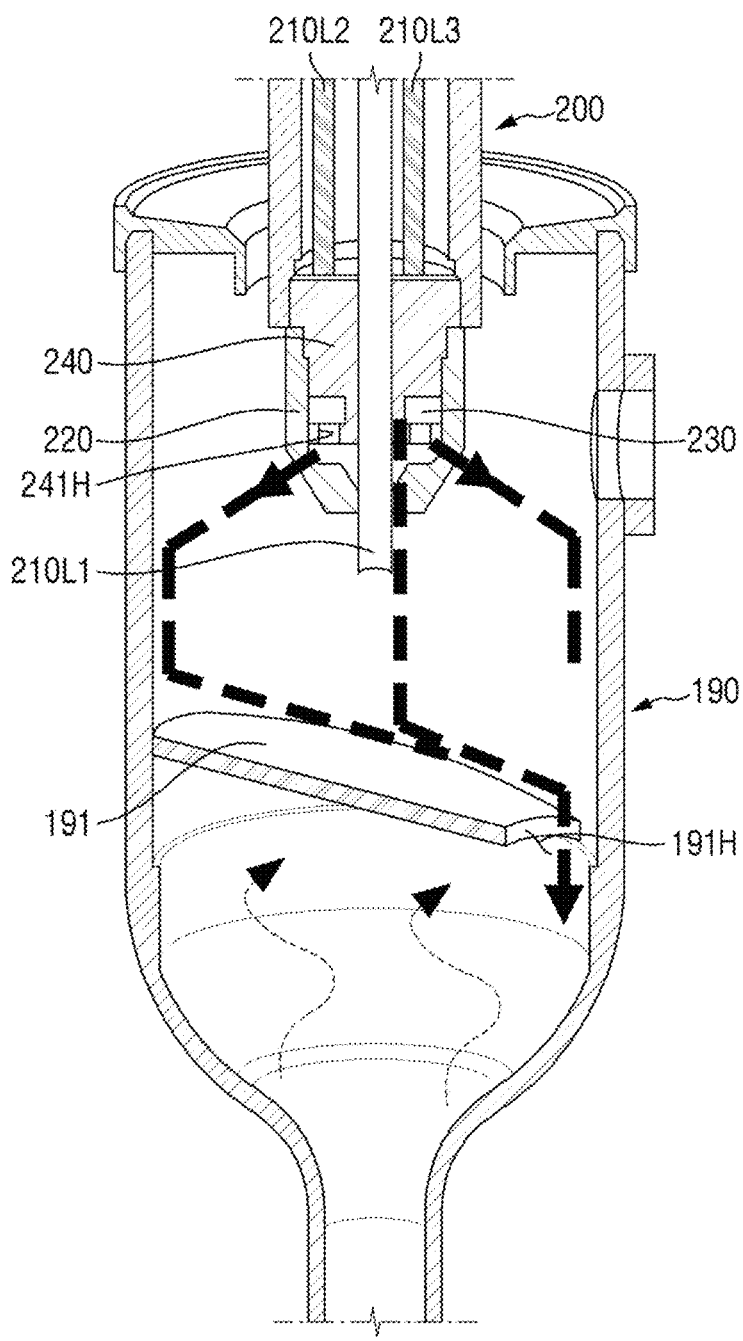

[FIG. 3]
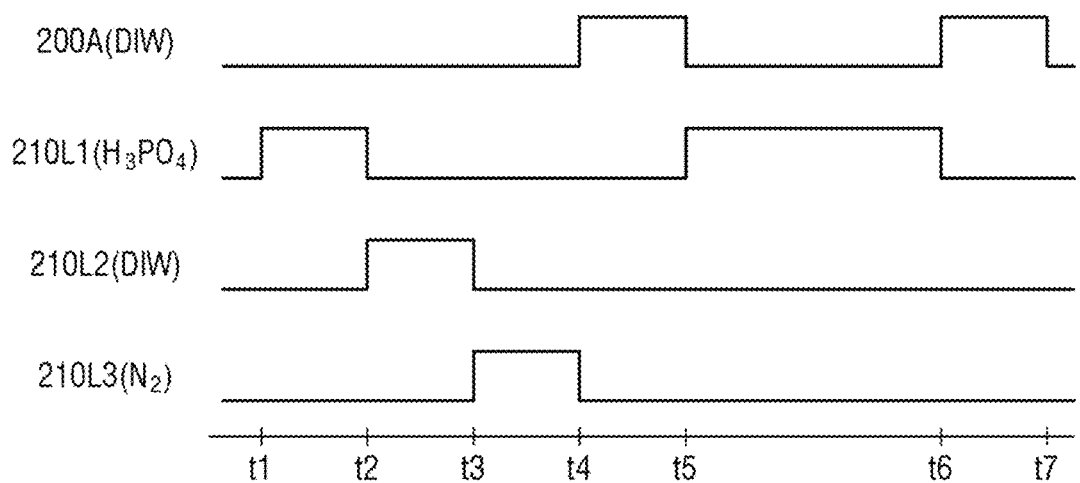

[FIG. 4]
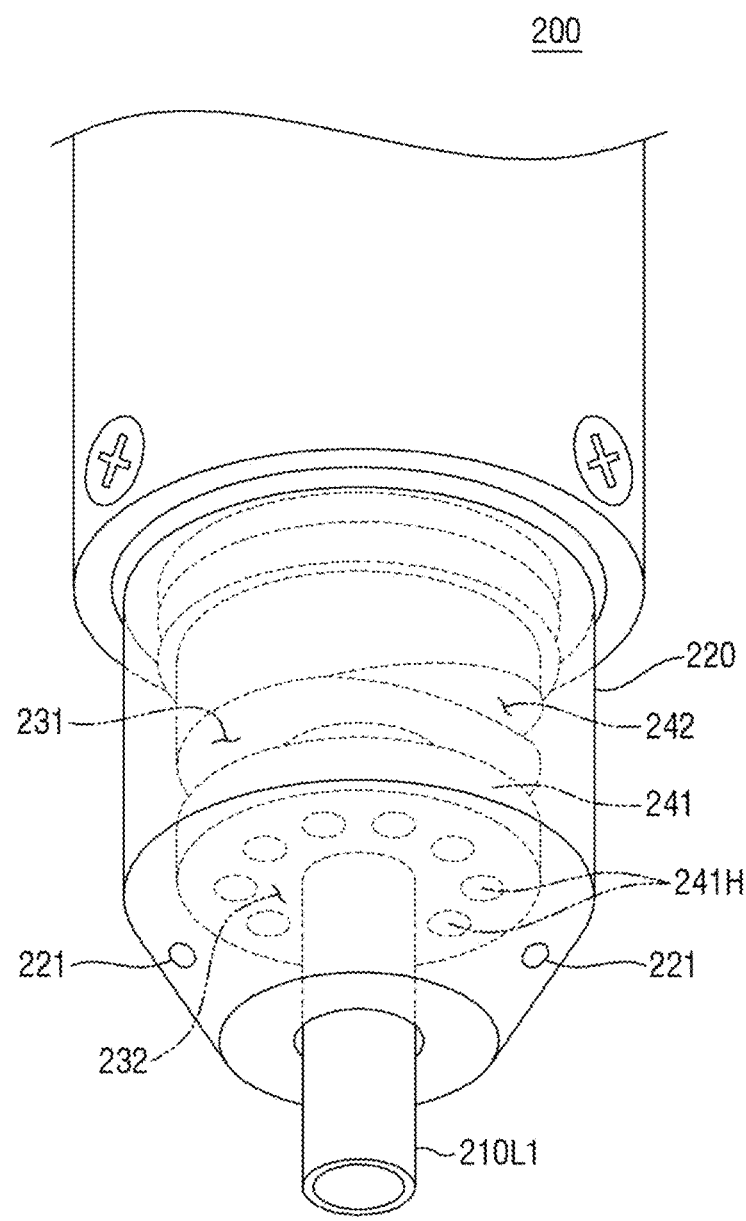

[FIG. 5]
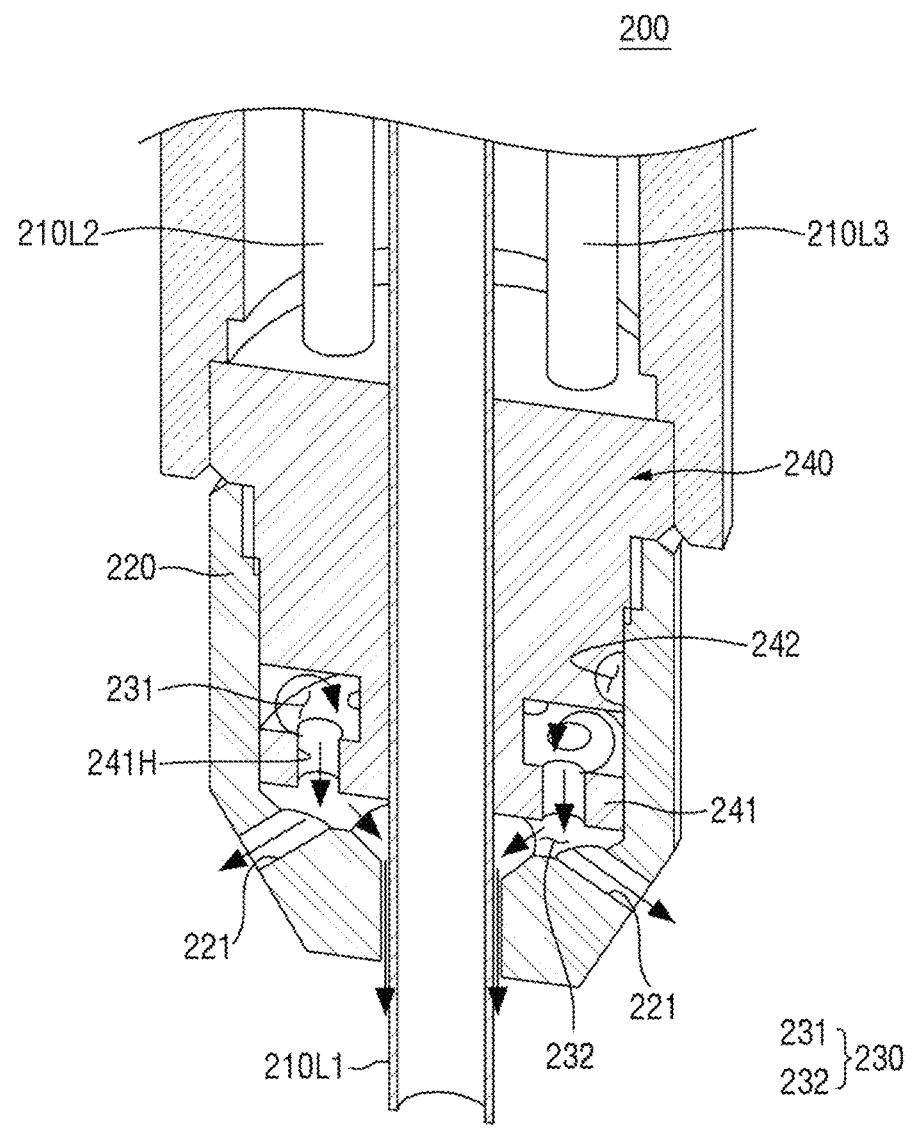

[FIG. 6]
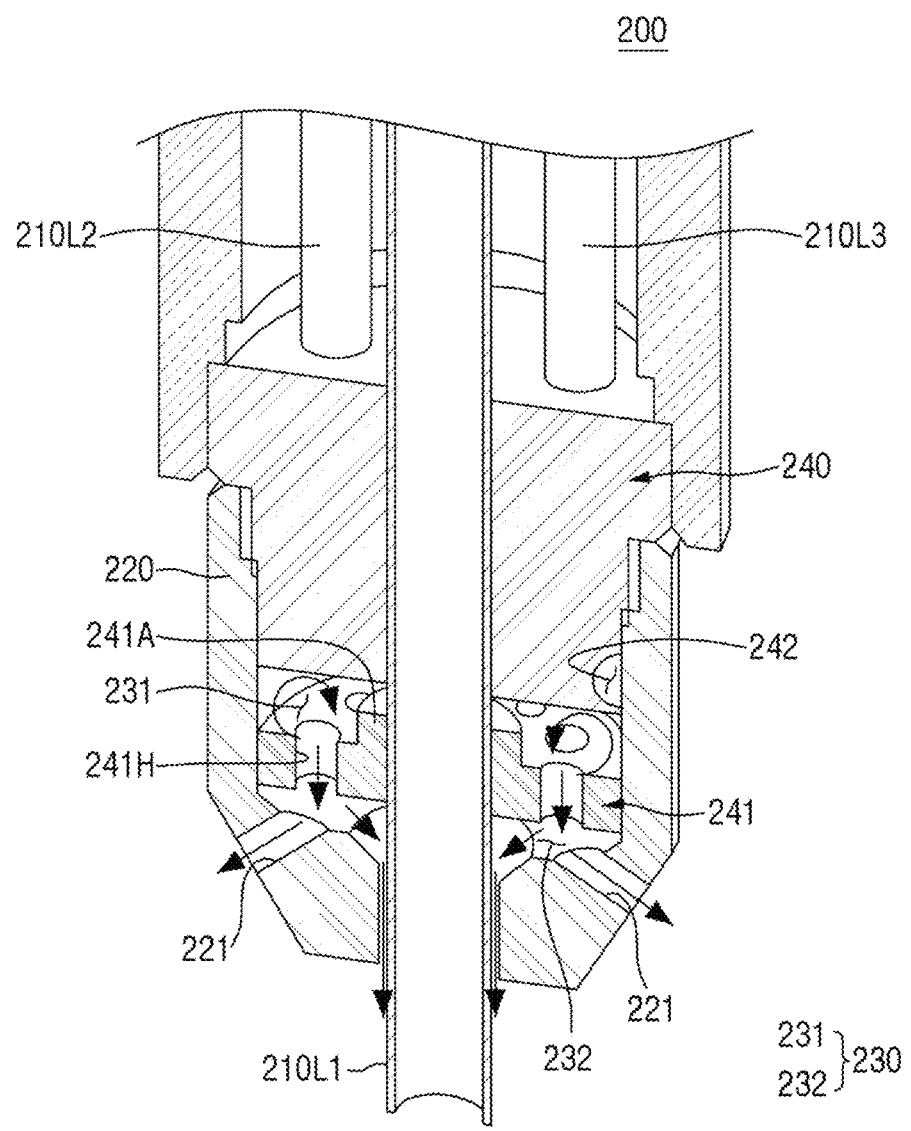

UNIT FOR SUPPLYING CHEMICAL AND APPARATUS FOR TREATING SUBSTRATE WITH THE UNIT

CROSS-REFERENCE TO RELATED APPLICATION

This application claims priority from Korean Patent Application No. 10-2022-0096234 filed on Aug. 2, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a unit for supplying a chemical and an apparatus for treating a substrate with the unit.

2. Description of the Related Art

A semiconductor device may be manufactured by repeatedly performing a series of production processes on a silicon wafer used as a substrate. For instance, a deposition process for forming a thin film on a substrate, a photolithography process for forming a photoresist pattern on the thin film, or an etching process for patterning or removing the thin film may be performed.

The etching process may be divided into the dry etching process and the wet etching process, and the latter process may be divided into a single-type process that treats one single substrate at a time and a batch type-process that collectively processes a plurality of substrates at the same time. During the rotation of the substrate, a single-type etching device may supply an etchant to the substrate and remove a thin film via a reaction between the thin film and the etchant, wherein by-products produced by the reaction, and the remaining etchant can be removed from the substrate by rotation.

For example, in the case of a silicon nitride film formed on a substrate, the silicon nitride film may be removed using an etchant including phosphoric acid and water. In that case, in order to increase the reaction velocity between the silicon nitride film and the etchant, the etchant may be heated and then supplied onto a central part of the substrate. The etchant may be diffused from the central part of the substrate to an edge part thereof by the rotation of the substrate, and by-products and the etchant may be removed from the substrate by the centrifugal force.

SUMMARY

Meanwhile, contamination affecting a process due to various factors such as scattering or rebounding may occur in a nozzle configured to discharge a chemical. Efforts for improvement have been made to remove reverse contamination that may occur in the nozzle.

Aspects of the present disclosure provide a unit for supplying a chemical and an apparatus for treating a substrate with the unit capable of cleaning a chemical discharge pipe constituting a nozzle.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

[Technical Liquid]

According to an aspect of the present disclosure, there is provided an apparatus for treating a substrate, comprising: a chemical discharge pipe; a cover configured to surround the chemical discharge pipe; a buffer disposed in a space between the chemical discharge pipe and the cover; a chemical supplier configured to supply a chemical to the chemical discharge pipe; a cleaning liquid supplier configured to supply a cleaning liquid via the cover; and a dry gas supplier configured to supply a dry gas via the cover. The supplied cleaning liquid is sprayed by passing through the buffer via a space between the outside of the chemical discharge pipe and the inside of the cover to clean a tip of the chemical discharge pipe, and the supplied dry gas is sprayed by passing through the buffer via the space between the outside of the chemical discharge pipe and the inside of the cover to dry the tip of the chemical discharge pipe.

The buffer may form a first space, and a second space disposed adjacent to the first space, disposed adjacent to an outlet of the chemical discharge pipe as compared to the first space and configured to communicate with the first space, and further include a partition member configured to partition the first space and the second space and communicate between the first space and the second space.

The first space and the second space may be annular, and the first space may be formed larger than the second space.

The partition member may surround the chemical discharge pipe and have a circular structure, and may radially form a plurality of through holes configured to communicate between the first space and the second space.

The apparatus for treating a substrate may further include an intermediate member configured to: surround the chemical discharge pipe inside the cover; arrange the partition member to intersect between the first space and the second space; and communicate between the cleaning liquid supplier and the dry gas supplier so that the cleaning liquid and the dry gas are supplied from the cleaning liquid supplier and the dry gas supplier to the first space of the buffer.

The intermediate member may further form a spiral hole through which the cleaning liquid and the dry gas are supplied from the cleaning liquid supplier and the dry gas supplier to the first space and which is provided in a spiral shape, and the cleaning liquid and the dry gas may clean and dry the inside of the cover via the spiral hole before passing through the buffer.

The apparatus for treating a substrate may further include: a cleaning liquid pipe to which the cleaning liquid is supplied from the cleaning liquid supplier; and a dry gas pipe to which the dry gas is supplied from the dry gas supplier, and the intermediate member may communicate between the cleaning liquid pipe and the dry gas pipe.

The cover may further form a cleaning hole communicating with the second space.

The cleaning hole may be penetrated in a diagonal direction from the cover, and may further include a home port disposed adjacent to a substrate support member supporting the substrate, and configured to accommodate the chemical discharge pipe and the cover, and the cleaning liquid and the dry gas discharged in the diagonal direction via the cleaning hole may be discharged towards an inner circumferential wall of the home port.

A lower end of the cover may have a tapered shape, and the cleaning hole may be disposed in the lower end thereof.

According to an aspect of the present disclosure, there is also provided a unit for supplying a chemical comprising: a chemical supplier configured to supply a chemical; a cleaning liquid supplier configured to supply a cleaning liquid; and a dry gas supplier configured to supply a dry gas, the unit comprising: a chemical discharge pipe to which the chemical is supplied from the chemical supplier; a cover surrounding the chemical discharge pipe, to which the cleaning liquid is introduced from the cleaning liquid supplier, and to which the dry gas is introduced from the dry gas supplier; and a buffer disposed in a space between the chemical discharge pipe and the cover and configured to form a first space, and a second space disposed adjacent to the first space, disposed adjacent to an outlet of the chemical discharge pipe as compared to the first space and communicating with the first space. The supplied cleaning liquid is sprayed by passing through the buffer via a space between the outside of the chemical discharge pipe and the inside of the cover to clean a tip of the chemical discharge pipe, and the supplied dry gas is sprayed by passing through the buffer via the space between the outside of the chemical discharge pipe and the inside of the cover to dry the tip of the chemical discharge pipe.

The first space and the second space may be annular, and the first space may be formed larger than the second space.

The unit for supplying a chemical may further include a partition member configured to surround the chemical discharge pipe inside the cover and intersect between the first space and the second space. The partition member may surround the chemical discharge pipe and have an annular structure, and may radially form a plurality of through holes configured to communicate between the first space and the second space.

The unit for supplying a chemical may further include an intermediate member provided with the partition member and configured to communicate between the cleaning liquid supplier and the dry gas supplier so that the cleaning liquid and the dry gas are supplied from the cleaning liquid supplier and the dry gas supplier to the first space.

The intermediate member may further form a spiral hole through which the cleaning liquid and the dry gas are supplied from the cleaning liquid supplier and the dry gas supplier to the first space and which is provided in a spiral shape. The cleaning liquid and the dry gas may clean and dry the inside of the cover via the spiral hole before passing through the buffer.

The unit for supplying a chemical may include: a cleaning liquid pipe to which the cleaning liquid is supplied from the cleaning liquid supplier; and a dry gas pipe to which the dry gas is supplied from the dry gas supplier. The intermediate member may communicate between the cleaning liquid pipe and the dry gas pipe.

The cover may further form a cleaning hole communicating with the second space.

The cleaning hole may be penetrated in a diagonal direction from the cover.

A lower end of the cover may have a tapered shape, and the cleaning hole may be disposed in the lower end thereof.

Specific details of other embodiments are included in the detailed description and the drawings.

Advantageous Effects

A unit for supplying a chemical and an apparatus for treating a substrate with the unit can clean a chemical discharge pipe to prevent contamination affecting a process.

BRIEF DESCRIPTION OF THE DRAWINGS

The above and other aspects and features of the present disclosure will become more apparent by describing in detail exemplary embodiments thereof with reference to the attached drawings, in which:

FIG. 1 is a diagram illustrating an apparatus for treating a substrate according to some embodiments of the present disclosure;

FIG. 2 is a diagram illustrating a state where a unit for supplying a chemical of the apparatus for treating a substrate according to some embodiments of the present disclosure is settled in a home port;

FIG. 3 is a diagram illustrating a time when a fluid of the apparatus for treating a substrate according to some embodiments of the present disclosure is supplied;

FIG. 4 is a diagram illustrating the unit for supplying a chemical of the apparatus for treating a substrate according to a first embodiment of the present disclosure;

FIG. 5 is a diagram illustrating the inside of the unit for supplying a chemical of the apparatus for treating a substrate according to the first embodiment of the present disclosure; and FIG. 6 is a diagram illustrating the inside of the unit for supplying a chemical of the apparatus for treating a substrate according to a second embodiment of the present disclosure.

DETAILED DESCRIPTION OF THE EMBODIMENTS

Hereinafter, embodiments of the present disclosure will be described with reference to the attached drawings. The merits and characteristics of the present disclosure and a method for achieving the merits and characteristics will become more apparent from the embodiments described in detail in conjunction with the accompanying drawings. However, the present disclosure is not limited to the disclosed embodiments, but may be implemented in various different ways. The embodiments are provided to only complete the disclosure of the present disclosure and to allow those skilled in the art to understand the category of the present disclosure. The present disclosure is defined by the category of the claims. Like numbers refer to like elements throughout the description of the figures.

Although the first, second, etc. are used to describe various elements, components and/or sections, these elements, components and/or sections are of course not limited by these terms. These terms are only used to distinguish one element, component or section from another element, component or section. Therefore, the first device, the first component, or the first section mentioned below may be a second device, a second component, or a second section within the technical spirit of the present disclosure.

The terminology used herein is for the purpose of describing particular embodiments only and is not intended to be limiting of the invention. In this specification, the singular also includes the plural unless specifically stated otherwise in the phrase. As used herein, "comprises" and/or "comprising" refers to the presence of one or more other components, steps, operations and/or elements. Or does not exclude additions.

FIG. 1 is a diagram illustrating an apparatus for treating a substrate according to some embodiments of the present disclosure. FIG. 2 is a diagram illustrating a state where a unit for supplying a chemical of the apparatus for treating a substrate according to some embodiments of the present disclosure is settled in a home port. FIG. 3 is a diagram illustrating a time when a fluid of the apparatus for treating a substrate according to some embodiments of the present disclosure is supplied. FIG. 4 is a diagram illustrating the unit for supplying a chemical of the apparatus for treating a substrate according to a first embodiment of the present disclosure. FIG. 5 is a diagram illustrating the inside of the unit for supplying a chemical of the apparatus for treating a substrate according to the first embodiment of the present disclosure.

Referring to FIGS. 1 to 5, an apparatus 100 for treating a substrate according to one embodiment of the present disclosure may perform an etching process exemplarily. However, the present disclosure is not limited thereto, and the apparatus 100 for treating a substrate may perform a photolithography process (photo process) or a cleaning process, or may perform the photolithography process and the cleaning process together. In other words, the apparatus 100 for treating a substrate according to the present embodiment may perform a variety of processes for treating the substrate by supplying a chemical. Hereinafter, performing the etching process will be described.

The apparatus 100 for treating a substrate may perform the etching process, as well as the cleaning process together with the etching process in one chamber. For example, a chemical supply unit 200 configured to supply the chemical for the etching process and a cleaning liquid supply nozzle 200A configured to supply a cleaning liquid for a substrate may be installed adjacent to each other in an upper part of a substrate support member 110. The cleaning liquid for a substrate described herein is provided as a cleaning liquid for cleaning the substrate, and a cleaning liquid discharged from a cleaning liquid supplier 160 described below may be distinguished from a cleaning liquid for tip cleaning for cleaning a chemical discharge pipe 210L1. However, the type of cleaning liquids may be the same.

For instance, the chemical in the etching process may be made up of phosphoric acid ($H_3PO_4$) as an etchant. A fluid in the cleaning process for cleaning the substrate may be made up of DIW as a cleaning liquid, and a cleaning liquid for cleaning the chemical discharge pipe 210L1 may be made up of DIW identically or similarly to the cleaning liquid for cleaning the substrate W.

Specifically, the apparatus 100 for treating a substrate may include the support member 110, a cup part 130, a chemical supply unit 200, a chemical supplier 150, a cleaning liquid supplier 160, a dry gas supplier 170 and a home port 190.

The substrate support member 110 may support the substrate W during the process. The substrate support member 110 may be equipped with a support plate 111 having a circular upper surface, a pin member 112 installed on an upper surface of the support plate 111, and a chucking pin 113. The pin member 112 may support the substrate W on a lower surface of the substrate W. The chucking pin 113 may support a side surface of the substrate W to align the substrate W so that the substrate W is placed in a given position. Furthermore, the substrate support member 110 may be rotated by a driver 120 such as a motor during the process.

The cup part 130 may be disposed around the substrate support member 110. The cup part 130 may have a cylindrical shape, but the present disclosure is not limited thereto. An exhaust hole (not shown) may be formed in a lower wall of the cup part 130. An exhaust pipe (not shown) may be installed in communication with the exhaust hole. An exhaust member (not shown) such as a pump may be connected to the exhaust pipe. The exhaust member may supply negative pressure to exhaust air inside the cup part 130 including the chemical scattered by the rotation of the substrate W.

When the chemical supply unit 200 performs the etching process, it can apply the chemical to a treatment surface of the substrate W placed on the substrate support member 110. The chemical supply unit 200 may receive fluids (e.g., an etchant, a cleaning liquid, and a dry gas) from a chemical supply source while waiting at the home port 190.

The chemical supply source may include, for instance, the chemical supplier 150, the cleaning liquid supplier 160, and the dry gas supplier 170. The chemical supplier 150 may supply the chemical to the chemical discharge pipe 210L1, and the chemical stored in the chemical supplier 150 herein may be an etchant. The cleaning liquid supplier 160 may supply the cleaning liquid (i.e., a cleaning liquid for tip cleaning of the chemical discharge pipe 210L1) via a cover 220. The dry gas supplier 170 may supply the dry gas via the cover 220. Furthermore, each of the chemical supplier 150, the cleaning liquid supplier 160, and the dry gas supplier 170 may be connected to the chemical discharge pipe 210L1, a cleaning liquid pipe 210L2, and a dry gas pipe 210L3 provided in the chemical supply unit 200 through which the fluid passes.

In addition, the internal structure of the chemical supply unit 200 will be described below with reference to FIGS. 4 and 5.

The home port 190 may be disposed adjacent to the substrate support member 110 inside the chamber and accommodate the chemical discharge pipe 210L1 and the cover 220 because the chemical supply unit 200 can wait. The inner circumferential wall of the home port 190 may be cleaned by the cleaning liquid discharged from the cover 220 in a diagonal direction via a cleaning hole 221 of the cover 220 described below.

Referring to FIG. 2, in the home port 190, a hollow hole may be formed to accommodate the chemical supply unit 200, and a blocking plate 191 may be provided to prevent a fume from flowing into the chemical supply unit 200. Herein, the blocking plate 191 may be provided in an inclined shape, and a hole 191H may be formed so that the fluid discharged from the chemical supply unit 200 can be discharged to the outside.

The fluids (e.g., an etchant, a cleaning liquid, and a dry gas) supplied/discharged from the substrate treatment process will be described below with reference to FIG. 3 (where a horizontal axis means time and a vertical axis may mean a flow rate). However, since the size/ratio of the flow rate and time are only an example, the present disclosure is not limited thereto. Furthermore, the flow rate and discharge time of the fluid may be controlled according to one embodiment.

Prior to the description, times t1 to t5 may refer to the time when the chemical supply unit 200 is waiting at the home port 190. However, unlike the chemical supply unit 200, the cleaning liquid supply nozzle 200A may be disposed facing an upper part of the substrate W and discharge the cleaning liquid for a substrate to the substrate W, thus forming a pre wetting state of the substrate W.

The times t5 and t6 may refer to an etching process time to discharge the etchant in a state where the chemical supply unit 200 is disposed in the upper part of the substrate W by deviating from the home port 190. Meanwhile, for t5 to t6 hours, the cleaning liquid supply nozzle 200A may be in a state of blocking the substrate cleaning liquid from being discharged. In other words, the arrangements and the supply states of the chemical supply unit 200 and the cleaning liquid supply nozzle 200A may be different from each other for t1 to t6 hours. Furthermore, times t6 to t7 not described herein may refer to a time to clean the substrate W.

Briefly explaining the fluid supply of the cleaning liquid supply nozzle 200A, the chemical supply unit 200 may be waiting in the home port 190 before performing the etching process of the substrate W. In that case, the chemical supply unit 200 may perform a pre-dispense operation, and accordingly, the etchant supplied from the chemical supplier 150 may be discharged to the home port 190 via the chemical supply unit 200.

In other words, the chemical supply unit 200 waiting at the home port 190 may receive and discharge the etchant so that the etchant supplied for the etching process of the previously treated substrate W can be discharged not to stay in the chemical discharge pipe 210L1 of the chemical supply unit 200, thereby injecting a fresh etchant.

When the etchant is supplied from the home port 190 to the chemical supply unit 200, the chemical supply unit 200 may receive the cleaning liquid and the dry gas for tip cleaning of the chemical discharge pipe 210L1 from the cleaning liquid supplier 160 and the dry gas supplier 170 so that a tip of the chemical discharge pipe 210L1 can be cleaned along with the pre-dispense operation of the chemical supply unit 200.

In this regard, a discharge amount of the fluid with respect to the time of FIG. 3 will be described below.

First, the etchant (indicated by phosphoric acid ($H_3PO_4$)) may be discharged via the chemical discharge pipe 210L1, and may be supplied from the chemical supplier 150 for t1 to t2 hours and discharged to the home port 190. When the etchant is discharged to the home port 190 for the pre-dispense operation, the tip of the chemical discharge pipe 210L1 needs to be cleaned so that the etchant does not stay on the tip thereof.

In order to clean the tip of the chemical discharge pipe 210L1, the chemical supply unit 200 may receive the cleaning liquid for tip cleaning (indicated by DIW) from the cleaning liquid supplier 160 for t2 to t3 hours. In that case, the cleaning liquid for tip cleaning may be introduced into the chemical supply unit 200 via the cleaning liquid pipe 210L2, and then discharged to the home port 190 after passing through a buffer 230 around the chemical discharge pipe 210L1.

In addition, the dry gas may be supplied so that the cleaning liquid for tip cleaning does not stay around the chemical discharge pipe 210L1, and the chemical supply unit 200 may receive the dry gas from the dry gas supplier 170 via the dry gas pipe 210L3 for t3 to t4 hours to dry the tip of the chemical discharge pipe 210L1. In that case, the dry gas may be discharged to the home port 190 after passing through the buffer 230 around the chemical discharge pipe 210L1. In the present embodiment, the dry gas may purge the buffer 230 and remove condensation of the cleaning liquid from a tip end.

Herein, the chemical discharge pipe 210L1, the cleaning liquid pipe 210L2, and the dry gas pipe 210L3 may be provided adjacent to each other in an intermediate member 240, but may be provided separately from each other so that each of fluids separately passes through the pipes.

In addition, since the temperature of the cleaning liquid may be below the one of the etchant and the flow rate of the cleaning liquid may be slower than that of the etchant, contamination for a rebound phenomenon that may occur in the home port 190 can be considerably reduced or prevented as compared to contamination by the cleaning liquid. In other words, since the cleaning liquid is discharged after discharging the etchant, the cleaning liquid can clean rebound contamination caused by the etchant and simultaneously reduce the rebound phenomenon as compared to the etchant. For instance, the etchant supplied from the chemical supplier 150 may have the flow rate of 800 ml per minute and the temperature of 150° C. to 175° C. The cleaning liquid supplied from the cleaning liquid supplier 160 may have the speed of 300 ml per minute and may be of room temperature.

In this way, the chemical supply unit 200 can perform the pre-dispense operation in the home port 190, and the cleaning liquid supply nozzle 200A can also clean the substrate W. In other words, when the chemical supply unit 200 waits at the home port 190 before the etching process, the cleaning liquid for a substrate can be discharged so that the substrate W is made prewetted, and accordingly, the cleaning liquid for a substrate can be discharged via the cleaning liquid supply nozzle 200A for t4 to t5 hours.

Hereinafter, the chemical supply unit 200 will be described with reference to FIGS. 4 and 5.

The chemical supply unit 200 may include the chemical discharge pipe 210L1, the cover 220, the buffer 230, and the intermediate member 240.

The chemical discharge pipe 210L1 may be in a state wherein the tip is exposed to the outside of the cover 220. The chemical discharge pipe 210L1 may communicate with the chemical supplier 150 and receive the etchant so that the etchant can be discharged to the substrate W.

As the cover 220 is a component that forms a space including the buffer 230 around the chemical discharge pipe 210L1, it may surround the chemical discharge pipe 210L1. The cover 220 may cover the chemical discharge pipe 210L1 to expose the tip in the end of the chemical discharge pipe 210L1 so that the end of the chemical discharge pipe 210L1 forms a nozzle structure. For example, a lower end of the cover 220 may have a tapered shape, and the cleaning hole 221 may be formed in the lower end of the cover 220.

As the cleaning hole 221 is a component through which the cleaning liquid is discharged to clean an inner wall of the home port 190, it may communicate with a second space 232 of the cover 220. For instance, the cleaning hole 221 may be penetrated in the diagonal direction from the lower end of the cover 220. In addition, two cleaning holes 221 are illustrated in FIG. 4, but the present disclosure is not limited thereto. The cleaning holes 221 may be radially provided in the lower end of the cover 220 to uniformly clean a circumferential surface of the inner wall of the home port 190.

The buffer 230 may be disposed in a space between the chemical discharge pipe 210L1 and the cover 220. The buffer 230 may refer to a partial area between the chemical discharge pipe 210L1 and the cover 220 as illustrated in FIG. 5. The buffer 230 may be formed so that the cleaning liquid and the dry gas stay in the buffer 230.

In other words, the cleaning liquid supplied from the cleaning liquid supplier 160 can be sprayed by passing through the buffer 230 via a space between the outside of the chemical discharge pipe 210L1 and the inside of the cover 220, thereby cleaning the tip of the chemical discharge pipe 210L1. The dry gas supplied from the dry gas supplier 170 can be sprayed by passing through the buffer 230 via the space between the outside of the chemical discharge pipe 210L1 and the inside of the cover 220, thereby drying the tip of the chemical discharge pipe 210L1.

For instance, the buffer 230 may include a first space 231 and the second space 232. The first space 231 and the second space 232 may be partitioned by a partition member 241 of the intermediate member 240.

The first space 231 may be disposed adjacent to an outlet of the cleaning liquid supplier 160 as compared to an outlet (i.e., the tip) of the chemical discharge pipe 210L1. In other words, the first space 231 is disposed upstream of the second space 232 to form a space where the cleaning liquid and the dry gas stay, and the first space 231 is formed larger than the second space 232 so that the cleaning liquid and the dry gas can stay sufficiently. Furthermore, the first space 231 and the second space 232 may be annular to uniformly clean and dry the inner circumference of the cover.

In brief, when the size of the first space 231 is formed too large, the time to discharge the dry gas may be delayed. Accordingly, in order to prevent an extension of the process time while sufficiently forming a space for fluid to stay inside the cover 220, the cleaning liquid and the dry gas may pass through the space between the chemical discharge pipe 210L1 and the cover 220 via a spiral hole 242 described below.

The second space 232 may communicate with the first space 231 and be disposed adjacent to the first space 231 and adjacent to the outlet of the chemical discharge pipe 210L1 as compared to the first space 231, and may be formed smaller than the first space 231. In other words, the second space 232 may be disposed downstream of the first space 231 and may form a space through which the fluid staying in the first space 231 and discharged therefrom passes.

In addition, the second space 232 may have an outlet formed along an outer circumferential surface of the chemical discharge pipe 210L1 so as to clean and dry the tip of the chemical discharge pipe 210L1, and may have a structure tapered towards the outlet.

The buffer 230 may be partitioned into the first space 231 and the second space 232 and have an annular shape so that the cleaning liquid may be uniformly distributed to the buffer 230 without tilting to one region thereof. Furthermore, the buffer 230 can be easily purged using the dry gas because a smaller space allows the reduction of time for fluid to fill and drain. Since the buffer 230 sequentially purges the first space 231 and the second space 232 without filling and emptying the first space 231 and the second space 232 at the same time, the time to fill and empty the first space 231 can achieve a purging time, which facilitates the purging using the dry gas.

In addition, in brief, the first space 231 may not be excessively increased by the spiral hole 242, which can minimize or avoid the problem of increasing the amount of dry gas to solve the residual cleaning liquid.

The intermediate member 240 may communicate with the cleaning liquid supplier 160 and the dry gas supplier 170 so that the cleaning liquid and the dry gas are supplied from the cleaning liquid supplier 160 and the dry gas supplier 170 to the first space 231 of the buffer 230. The intermediate member 240 may be provided with a partition member 241 configured to surround the chemical discharge pipe 210L1 inside the cover 220 and intersect between the first space 231 and the second space 232, and may have a spiral hole 242 formed therein.

The partition member 241 may partition the first space 231 and the second space 232. The partition member 241 may surround the chemical discharge pipe 210L1 and have an annular structure, and may radially form a plurality of through holes 241H configured to communicate between the first space 231 and the second space 232. Accordingly, the cleaning liquid and the dry gas may be uniformly discharged from the first space 231 to the second space 232.

In addition, the partition member 241 may partition the first space 231 and the second space 232; however, as described above, the space may be partitioned at a position where the first space 231 is formed larger than the second space 232, which can sufficiently secure the time when the cleaning liquid stays in the first space 231 by the partition member 241.

On the other hand, although it is illustrated that the partition member 241 of the present embodiment is integrated with the intermediate member 240, the present disclosure is limited thereto. Another modification will be described below with reference to FIG. 6.

The spiral hole 242 may be formed as a spiral hole in the intermediate member 240 to form a movement path through which the cleaning liquid and the dry gas pass are supplied from the cleaning liquid supplier 160 and the dry gas supplier 170 to the first space 231. In other words, the cleaning liquid and the dry gas can clean and dry the inside of the cover 220 via the spiral hole 242 before passing through the cleaning liquid and the dry gas pass through the buffer 240.

The spiral hole 242 may optimize the space of the buffer 230. In other words, since the excessive increase in the size of the buffer 230 causes an increase of the space (volume of the buffer 230) where the cleaning liquid stay, the amount of dry gas has to be increased so that the cleaning liquid cannot stay, which may delay the working time. In order to avoid such concerns, the upstream space of the buffer 230 is provided with the spiral hole 242 with a flow path formed in a spiral shape. By cleaning and drying the upstream space of the buffer 230 using the spiral hole 242, the space of the buffer 230 may be formed small corresponding thereto. Accordingly, the time to fill or empty the buffer 230 that may be formed in a small space can be reduced. Therefore, there is no need to increase the flow rate to fill the space because of the excessively large space of the buffer 230, which can prevent a delay in the work time.

Hereinafter, a modification of the present embodiment will be described with reference to FIG. 6, and redundant descriptions of the same configuration with the same function as described above will be omitted.

FIG. 6 is a diagram illustrating the inside of the unit for supplying a chemical of the apparatus for treating a substrate according to a second embodiment of the present disclosure. Referring to FIG. 6, the difference from the content described with reference to FIGS. 4 and 5 will be mainly described.

Referring to FIG. 6, the chemical supply unit 200 includes the chemical discharge pipe 210L1, the cover 220, the buffer 230, and the intermediate member 240 identical or similarly to the first embodiment. However, there is a difference in that the intermediate member 240 of the second embodiment is not integrated with the partition member 241 and is separated therefrom.

In other words, the partition member 241 of the present embodiment may partition the first space 231 and the second space 232 identically or similarly to the first embodiment. Unlike the first embodiment, the partition member 241 may be separated from the intermediate member 240 in an uncoupled form so that at least part of the inner circumferential surface of the cover 220 and the chemical discharge pipe 210L1 may be exposed to the first space 231.

For instance, the partition member 241 may have an annular structure identically or similarly to the first embodiment, and may radially form the plurality of through holes 241H. However, unlike the first embodiment, the partition member 241 separated from the intermediate member 240 in the uncoupled form may be provided with a projection 241A extending identically to the longitudinal direction of the chemical discharge pipe 210L1 so that the partition member 241 is horizontal without tilting. However, since the projection 241A is meant to maintain the horizontality of the partition member 241, various modifications can be made as the projection 241A is provided adjacent to the cover 220 while extending along the longitudinal direction of the inner circumferential surface of the cover 220.

In addition, the configuration described in the present embodiments can be made various modified embodiments, and thus the first embodiment and the second embodiment may be combined. In addition, the partition member 241 of the first embodiment may be integrally connected to the intermediate member 240; however, a connection part may not be provided to surround the chemical discharge pipe 210L1, and the intermediate member 240 and the chemical discharge pipe 210L1 may be connected at a position where they get in contact with an inner wall of the cover 220, as another modification. Accordingly, the periphery of the chemical discharge pipe 210L1 may be exposed from the intermediate member 240 in the periphery the first space 231.

Alternatively, various modifications can be made to a pin (not shown) which may connect between the chemical discharge pipe 210L1 and the inner circumferential surface of the cover 220 so that a connection of the partition member 241 connected to the intermediate member 240 is not in contact the inner circumferential surface of the cover 220 while not surrounding the chemical discharge pipe 210L1.

In other words, the intermediate member 240 and the partition member 241 are capable of various modifications for cleaning the outer circumferential surface of the chemical discharge pipe 210L1 as well as the inside of the cover 220 via the first space 231.

The apparatus 100 for treating a substrate according to the aforementioned embodiments can clean the chemical discharge pipe 210L1 to prevent contamination affecting the process.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

EXPLANATION OF REFERENCE NUMERAL

100: Apparatus for Treating Substrate
110: Support Member
130: Cup Part
190: Home Port
200: Chemical Supply Unit
210L1: Chemical Discharge Pipe
220: Cover
230: Buffer
240: Intermediate Member

What is claimed is:

1. An apparatus for treating a substrate, comprising:
a chemical discharge pipe;
a cover configured to surround the chemical discharge pipe;
a buffer disposed in a space between the chemical discharge pipe and the cover;
a chemical supplier configured to supply a chemical to the chemical discharge pipe;
a cleaning liquid supplier configured to supply a cleaning liquid via the cover; and
a dry gas supplier configured to supply a dry gas via the cover,
wherein the supplied cleaning liquid is sprayed by passing through the buffer via a space between the outside of the chemical discharge pipe and the inside of the cover to clean a tip of the chemical discharge pipe, and
the supplied dry gas is sprayed by passing through the buffer via the space between the outside of the chemical discharge pipe and the inside of the cover to dry the tip of the chemical discharge pipe.

2. The apparatus for treating a substrate of claim 1, wherein the buffer forms a first space, and a second space disposed adjacent to the first space, disposed adjacent to an outlet of the chemical discharge pipe as compared to the first space and configured to communicate with the first space, and
the buffer further comprises a partition member configured to partition the first space and the second space and communicate between the first space and the second space.

3. The apparatus for treating a substrate of claim 2, wherein the first space and the second space are annular,
wherein the first space is formed larger than the second space.

4. The apparatus for treating a substrate of claim 2, wherein the partition member surrounds the chemical discharge pipe and has an annular structure, and radially forms a plurality of through holes configured to communicate between the first space and the second space.

5. The apparatus for treating a substrate of claim 2, further comprising an intermediate member configured to: surround the chemical discharge pipe inside the cover; arrange the partition member to intersect between the first space and the second space; and communicate between the cleaning liquid supplier and the dry gas supplier so that the cleaning liquid and the dry gas are supplied from the cleaning liquid supplier and the dry gas supplier to the first space of the buffer.

6. The apparatus for treating a substrate of claim 5, wherein the intermediate member further forms a spiral hole through which the cleaning liquid and the dry gas are supplied from the cleaning liquid supplier and the dry gas supplier to the first space and which is provided in a spiral shape,
wherein the cleaning liquid and the dry gas clean and dry the inside of the cover via the spiral hole before passing through the buffer.

7. The apparatus for treating a substrate of claim 5, further comprising:
a cleaning liquid pipe to which the cleaning liquid is supplied from the cleaning liquid supplier; and
a dry gas pipe to which the dry gas is supplied from the dry gas supplier,
wherein the intermediate member communicates between the cleaning liquid pipe and the dry gas pipe.

8. The apparatus for treating a substrate of claim 2, wherein the cover further forms a cleaning hole communicating with the second space.

9. The apparatus for treating a substrate of claim 8, wherein the cleaning hole is penetrated in a diagonal direction from the cover, and further comprises a home port disposed adjacent to a substrate support member supporting the substrate and configured to accommodate the chemical discharge pipe and the cover, wherein the cleaning liquid and the dry gas discharged in the diagonal direction via the cleaning hole are discharged towards an inner circumferential wall of the home port.

10. The apparatus for treating a substrate of claim 9, wherein a lower end of the cover has a tapered shape, and the cleaning hole is disposed in the lower end thereof.

11. A unit for supplying a chemical comprising: a chemical supplier configured to supply a chemical; a cleaning liquid supplier configured to supply a cleaning liquid; and a dry gas supplier configured to supply a dry gas, the unit comprising:

a chemical discharge pipe to which the chemical is supplied from the chemical supplier;

a cover surrounding the chemical discharge pipe, to which the cleaning liquid is introduced from the cleaning liquid supplier, and to which the dry gas is introduced from the dry gas supplier; and a buffer disposed in a space between the chemical discharge pipe and the cover, and configured to form a first space, and a second space disposed adjacent to the first space, disposed adjacent to an outlet of the chemical discharge pipe as compared to the first space and communicating with the first space, wherein the supplied cleaning liquid is sprayed by passing through the buffer via a space between the outside of the chemical discharge pipe and the inside of the cover to clean a tip of the chemical discharge pipe, and the supplied dry gas is sprayed by passing through the buffer via the space between the outside of the chemical discharge pipe and the inside of the cover to dry the tip of the chemical discharge pipe.

12. The unit for supplying a chemical of claim 11, wherein the first space and the second space are annular, wherein the first space is formed larger than the second space.

13. The unit for supplying a chemical of claim 11, further comprising a partition member configured to surround the chemical discharge pipe inside the cover and intersect between the first space and the second space, wherein the partition member surrounds the chemical discharge pipe and has an annular structure, and radially forms a plurality of through holes configured to communicate between the first space and the second space.

14. The unit for supplying a chemical of claim 13, further comprising an intermediate member provided with the partition member, and configured to communicate between the cleaning liquid supplier and the dry gas supplier so that the cleaning liquid and the dry gas are supplied from the cleaning liquid supplier and the dry gas supplier to the first space.

15. The unit for supplying a chemical of claim 14, wherein the intermediate member further forms a spiral hole through which the cleaning liquid and the dry gas are supplied from the cleaning liquid supplier and the dry gas supplier to the first space and which is provided in a spiral shape, wherein the cleaning liquid and the dry gas clean and dry the inside of the cover via the spiral hole before passing through the buffer.

16. The unit for supplying a chemical of claim 15, further comprising:

a cleaning liquid pipe to which the cleaning liquid is supplied from the cleaning liquid supplier; and a dry gas pipe to which the dry gas is supplied from the dry gas supplier, wherein the intermediate member communicates between the cleaning liquid pipe and the dry gas pipe.

17. The unit for supplying a chemical of claim 11, wherein the cover further forms a cleaning hole communicating with the second space.

18. The unit for supplying a chemical of claim 17, wherein the cleaning hole is penetrated in a diagonal direction from the cover.

19. The unit for supplying a chemical of claim 17, wherein a lower end of the cover has a tapered shape, and the cleaning hole is disposed in the lower end thereof.

* * * * *